United States Patent [19]

Hijikata et al.

[11] Patent Number: 5,338,331
[45] Date of Patent: Aug. 16, 1994

[54] LOW-PERMEABILITY HIGH-STRENGTH TARGET MATERIAL FOR THE FORMATION OF THIN MAGNETOOPTICAL RECORDING FILMS

[75] Inventors: Kenichi Hijikata; Shozo Komiyama; Hitoshi Maruyama, all of Omiya, Japan

[73] Assignee: Mitsubishi Materials Corporation, Tokyo, Japan

[21] Appl. No.: 892,361

[22] Filed: Jun. 2, 1992

[30] Foreign Application Priority Data

Jun. 12, 1991 [JP] Japan .................. 3-167793

[51] Int. Cl.$^5$ ............................. B22F 9/00
[52] U.S. Cl. ......................... 75/246; 148/301; 420/83; 428/694 RE
[58] Field of Search ................... 75/246, 245; 148/301; 420/83; 428/546, 567, 611, 694 RE

[56] References Cited

U.S. PATENT DOCUMENTS

| | | | |
|---|---|---|---|
| 3,652,343 | 3/1972 | Becker | 420/435 |
| 3,853,640 | 12/1974 | Smeggil | 148/105 |
| 4,620,872 | 11/1986 | Hijikata et al. | 75/246 |
| 4,824,481 | 4/1989 | Chatterjee et al. | 75/246 |
| 4,849,017 | 7/1989 | Sahashi et al. | 75/245 |
| 4,915,737 | 4/1990 | Morimoto et al. | 75/246 |
| 4,915,758 | 4/1990 | Morimoto et al. | 75/246 |
| 4,946,501 | 8/1990 | Nate et al. | 75/246 |
| 4,957,549 | 9/1990 | Matsumoto et al. | 75/246 |
| 4,992,095 | 2/1991 | Nate et al. | 75/246 |
| 5,062,885 | 11/1991 | Matsumoto et al. | 75/255 |

FOREIGN PATENT DOCUMENTS

| | | |
|---|---|---|
| 0288010 | 10/1988 | European Pat. Off. . |
| 0289315 | 11/1988 | European Pat. Off. . |
| 0289316 | 11/1988 | European Pat. Off. . |
| 0308201 | 3/1989 | European Pat. Off. . |
| 3537191 | 4/1986 | Fed. Rep. of Germany . |
| 61-119648 | 6/1986 | Japan . |
| 63-274763 | 11/1988 | Japan . |
| 1-198470 | 8/1989 | Japan . |
| 2-107762 | 4/1990 | Japan . |

OTHER PUBLICATIONS

Pat. Abstracts of Japan C-573, Mar. 6, 1989, vol. 13, No. 95 of JP 63-274763.
Pat. Abstracts of Japan C-651, Nov. 5, 1989, vol. 13, No. 494 of JP 1-198470.
Pat. Abstracts of Japan C-737, Jul. 5, 1990, vol. 14, No. 314 of JP 2-107762.

*Primary Examiner*—Donald P. Walsh
*Assistant Examiner*—Ngoclan T. Mai
*Attorney, Agent, or Firm*—Frishauf, Holtz, Goodman & Woodward

[57] ABSTRACT

A high-strength target material for forming a thin magnetooptical recording film having a structure comprising: (a) 20–75% of a complex phase in which at least one crystallized iron-group metal is dispersed finely and uniformly in a dendritic, acicular or block form in a proportion of 5–40%, of the total composition, in a matrix of an intermetallic compound of at least one first rare earth metal and at least one iron-group metal; (b) 15–40% of a rare earth metal phase of at least one second rare earth metal; and (c) the remainder being an intermetallic compound phase of a reaction phase of the complex phase and the rare earth metal phase, all percentages being by area, wherein the first and second rare earth metals are the same or different. The target material has such a low permeability that thin magnetooptical recording films can be formed by a magnetron sputtering process with a high utilization.

17 Claims, 4 Drawing Sheets

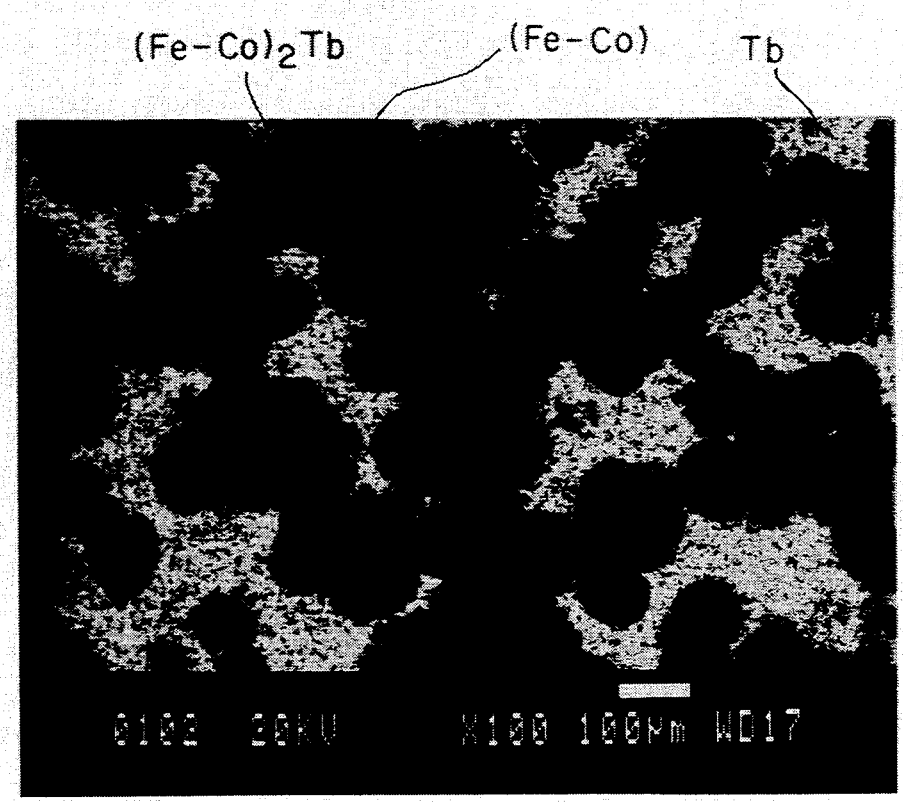

LOW-PERMEABILITY HIGH-STRENGTH TARGET MATERIAL FOR THE FORMATION OF THIN MAGNETOOPTICAL RECORDING FILMS

BACKGROUND OF THE INVENTION

This invention relates to a high-strength target material that has low permeability and which, hence, is suitable for use in the formation of thin magnetooptical recording films by magnetron sputtering, enabling thin film formation with high utilization factor (the proportion of the target material that is assumed by the amount of thin film formed).

A number of target materials are conventionally used in forming thin magnetooptical recording films by a magnetron sputtering process. Among those many target materials, the one that is described in Japanese Patent Public Disclosure No. 119648/1986 is known to have high strength and it has a structure that consists of:

25–60% (all percentages that appear herein are by area) of an iron-group metal phase composed of at least one metal selected from among Fe, Ni and Co;
10–45% of a rare earth metal phase composed of at least one metal selected from among Tb, Gd, Dy, Ho and Er; and
the remainder being an intermetallic compound phase composed of the phase of reaction between said iron-group metal phase and said rare earth metal phase.

With the tendency in recent years for forming thin magnetooptical recording films by factory automation with reduced man-power, an extension of the useful life of the target material, or an improvement in its utilization factor, has been strongly needed. To this end, the permeability of the target material has to be further lowered and the craters to be formed in the sputtered surface of the target material must have such a morphology that they extend broadly in a two-dimensional direction and that they are shallow.

SUMMARY OF THE INVENTION

Under the circumstances, the present inventors noted the prior art high-strength target material described in Japanese Patent Public Disclosure No. 119648/1986, supra, and conducted intensive studies with a view to further lowering its permeability. As a result, the inventors found that when the iron-metal phase of said prior art high-strength target material was replaced by a complex phase in which a crystallized iron-group metal was dispersed finely and uniformly in a dendritic, acicular or block form in a proportion of 5–40% (of the total phase) in a matrix composed of an intermetallic compound of a rare earth metal and an iron-group metal, the permeability of the target material was further lowered without impairing its strength, thereby successfully achieving a marked improvement in its utilization factor.

The present invention has been accomplished on the basis of this finding and It provides a high-strength target material that has a structure consisting of:

20–75% of a complex phase in which a crystallized iron-group metal is dispersed finely and uniformly in a dendritic, acicular or block form in a proportion of 5–40% (of the total phase) in a matrix composed of an intermetallic compound of at least one rare earth metal selected from among Tb, Gd, Dy, Ho, Tm and Er and at least one iron-group metal selected from among Fe, Ni and Co;
15–40% of a rare earth metal phase composed of at least one metal selected From among Tb, Gd, Dy, Ho, Tm and Er; and
the remainder being an intermetallic compound phase composed of the phase of reaction between said complex phase and said rare earth metal phase.

Having this structure, the target material of the present invention is low in permeability and hence exhibits high utilization factor when used in forming thin magnetooptical recording films by a magnetron sputtering process.

BRIEF DESCRIPTION OF THE DRAWINGS:

FIG. 1-*a* and FIG. 1-*b* are photographs showing the microstructure of sample 1 of the high-strength target material of Example 1 as taken with a metallurgical microscope;

FIG. 2-*a* and FIG. 2-*b* are photographs showing the microstructure of sample A of the high-strength target material of Example 2 as taken with a metallurgical microscope; and FIG. 3 is a photograph showing the microstructure of sample 1 of the prior art high-strength target material as taken with a metallurgical microscope.

DETAILED DESCRIPTION OF THE INVENTION:

The criticality of the proportions of the composing phases in the high-strength target material of the present invention is described below.

(a) Crystallized iron-group metal

The crystallized iron-group metal will be dispersed and distributed In a dendritic or acicular form (if an atomized powder is used as a starting powder) or in a block form (if the starting powder is prepared by pulverizing a cast ingot) so that it can improve the permeability of the target material without lowering its strength. If the proportion of the crystallized iron-group metal is less than 5%, it is unable to insure the desired high strength for the target material. If the proportion of the crystallized iron-group metal exceeds 40%, the permeability of the target material tends to increase rather than decrease. Hence, the proportion of the crystallized iron-group metal is specified to lie in the range of 5–40%.

(b) Complex phase

If the proportion of the complex phase is less than 20%, the relative proportion of the intermetallic compound phase will become excessive, making it difficult to insure the desired high strength for the target material. In addition, tile in-plane compositional profile in the bulk of the thin film will become nonuniform. If the proportion of the complex phase exceeds 75%, the relative proportion of the intermetallic compound that composes the complex phase becomes excessive and the in-plane compositional profile in the bulk of the thin film becomes nonuniform. Hence, the proportion of the complex phase is specified to lie in the range of 20–75%.

(c) Rare earth metal phase

Whether the proportion of the rare earth metal phase is less than 15% or more than 40%, it becomes difficult for a thin film having desired magnetic characteristics to be formed with a uniform concentration profile. Hence, the proportion of the rare earth metal phase is specified to lie in the range of 15–40%.

Figure 1:
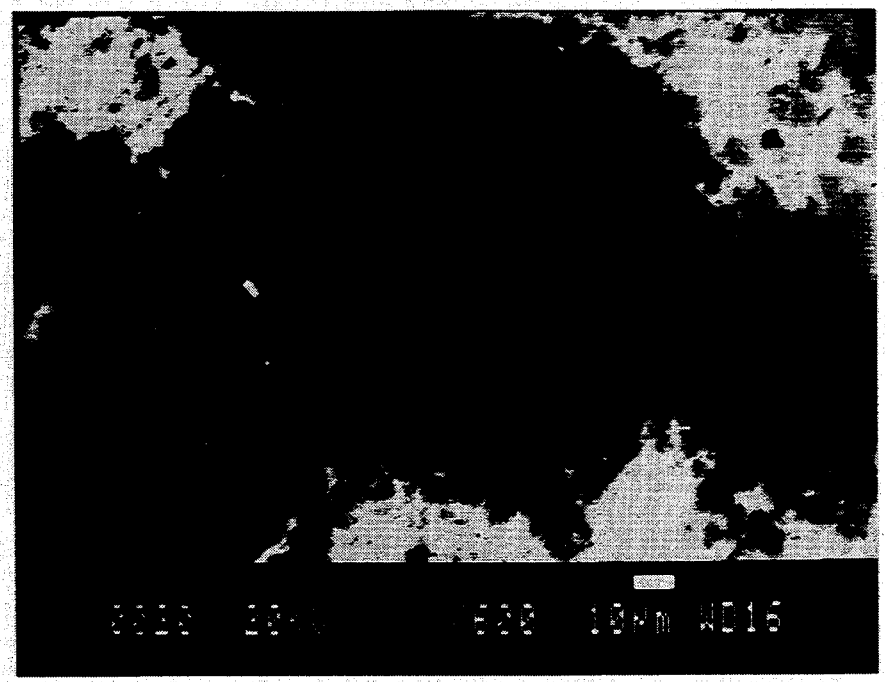
FIG. 1 is a photograph showing the microstructure of sample 1 of the high-strength target material of the present invention as taken with a metallurgical microscope.

The following examples are provided for the purpose of further illustrating the high-strength target material of the present invention but are in no way to be taken as limiting.

sure of $1 \times 10^{-5}$ Torr. Thereafter, the cans were hot rolled by three passes at a temperature of 600 °C., with the draft being 10 for each pass. After the hot pressing, the cans were subjected to a heat treatment for 15 h at a predetermined temperature in the range of 600°–800° C., whereby samples 1–12 of the high-strength target material of the present invention were prepared; each sample measured 127 mm in diameter by 3 mm in thickness. The proportions of the phases that composed the structures of samples 1–12 are listed in Tables 1 and 2. FIG. 1 is a pair of photographs showing the microstructure of sample 1 as taken with a metallurgical microscope (X100 for FIG. 1-$a$ and X600 for FIG. 1-$b$).

TABLE 1

| Sample High-Strength target material of the Invention | Proportions of mixing starting powders (wt %) | | | | Composing structure (area %) | | | | Permeability ($\mu$) | Deflective strength (kg/mm$^2$) | Utilization factor (vol %) |
|---|---|---|---|---|---|---|---|---|---|---|---|
| | Mixing proportions (wt %) | | Complex phase forming powder | Rare earth metal powder | Precipitated iron-group metal | Complex phase | Rare earth metal phase | Intermetallic compound phase | | | |
| | Rare earth metal | Iron-group metal | | | | | | | | | |
| 1 | Tb:10 | Fe:80, Co:10 | 59 | Tb:41 | 26 | 46 | 28 | bal. | 9 | 9 | 25 |
| 2 | Gd:22 | Co:78 | 77 | Gd:23 | 6 | 63 | 17 | bal. | 5 | 6 | 27 |
| 3 | Dy:3 | Fe:89, Co:8 | 51 | Dy:49 | 38 | 43 | 37 | bal. | 17 | 13 | 22 |
| 4 | Ho:3 | Ni:97 | 52 | Ho:48 | 20 | 23 | 17 | bal. | 11 | 11 | 24 |
| 5 | Tm:23 | Co:38, Ni:39 | 76 | Tm:24 | 7 | 74 | 22 | bal. | 4 | 5 | 27 |
| 6 | Er:19 | Fe:81 | 63 | Er:37 | 8 | 39 | 21 | bal. | 4 | 8 | 27 |

TABLE 2

| Sample High-Strength target material of the Invention | Proportions of mixing starting powders (wt %) | | | | Composing structure (area %) | | | | Permeability ($\mu$) | Deflective strength (kg/mm$^2$) | Utilization factor (vol %) |
|---|---|---|---|---|---|---|---|---|---|---|---|
| | Mixing proportions (wt %) | | Complex phase forming powder | Rare earth metal powder | Precipitated iron-group metal | Complex phase | Rare earth metal phase | Intermetallic compound phase | | | |
| | Rare earth metal | Iron-group metal | | | | | | | | | |
| 7 | Gd:5 | Co:95 | 56 | Ho:44 | 30 | 38 | 26 | bal. | 10 | 11 | 23 |
| 8 | Tm:21 | Fe:79 | 65 | Tm:10 Er:25 | 12 | 55 | 28 | bal. | 7 | 7 | 26 |
| 9 | Tb:15 | Fe:85 | 65 | Dy-20% Tm alloy | 35 | 20 | 51 | 25 | bal. | 9 | 9 | 25 |
| 10 | Gd:2, Dy:2, Er:14 | Fe:82 | 67 | Gd-50% Dy alloy | 33 | 14 | 47 | 19 | bal. | 7 | 7 | 26 |
| 11 | Dy:5, Tm:5, Ho:5 | Co:85 | 62 | Tb:38 | 19 | 48 | 27 | bal. | 9 | 8 | 25 |
| 12 | Tb:3, Ho:8, Gd:4, Er:8 | Fe:78 | 68 | Tb-50% Gd alloy | 32 | 6 | 48 | 21 | bal. | 5 | 7 | 27 |

EXAMPLE 1

Melts having the compositions listed in Tables 1 and 2 were prepared In an ordinary high-frequency melting furnace and atomized with a high-purity Ar gas having a dew point of −25° C. (the cooling rate varying from 10° to 10$^4$° C./sec) so as to form complex phase forming powders. These powders were classified to have particles sizes in the range of −150 to +325 mesh (100 $\mu$m on average) and mixed with the separately provided powders of various rare earth metals having an average particle size of 100 $\mu$m. The mixing proportions of the two powders are also listed in Tables 1 and 2. All runs of tile blends were packed into stainless steel cans having inside dimensions of 125 mm$^\Phi \times$ 5 mm$^H$, with a wall thickness of 1.2 mm, which were evacuated to a pres-

EXAMPLE 2

Figure 2:
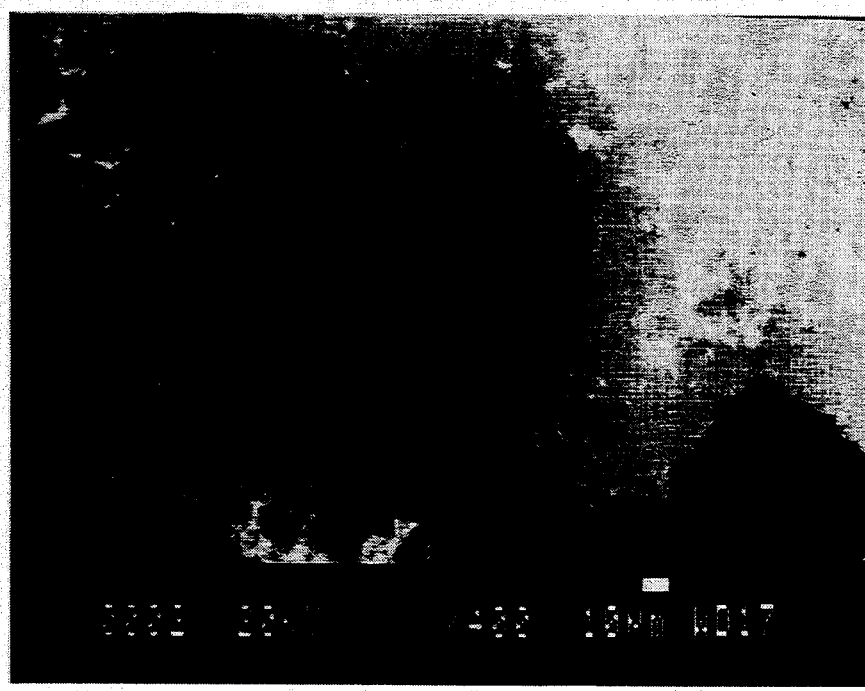
FIG. 2 is a photograph showing the microstructure of sample A of the high-strength target material of the present Invention as taken with a metallurgical microscope.
Figure 1A:
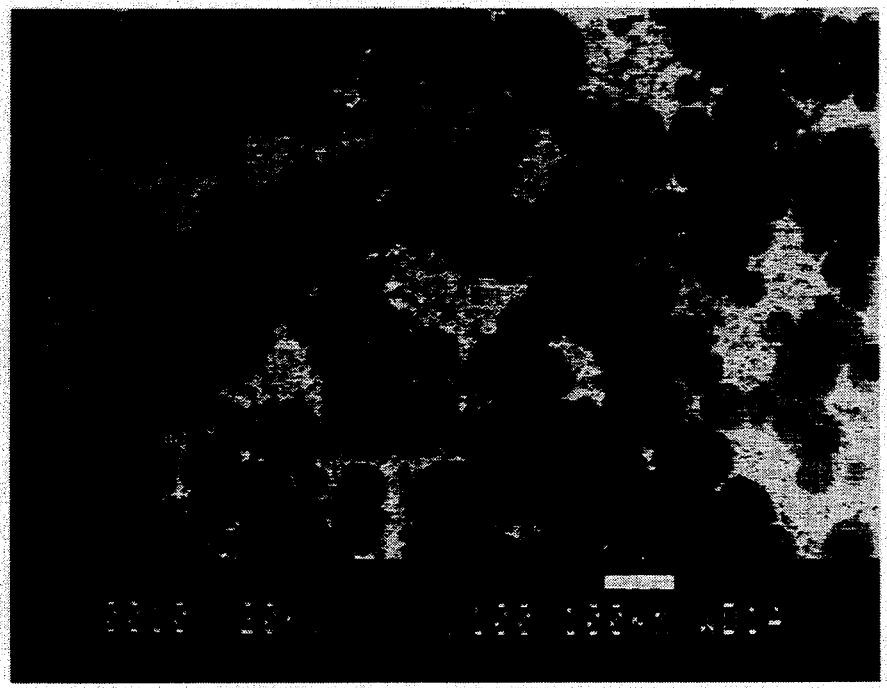
Figure 1B:
Figure 2A:
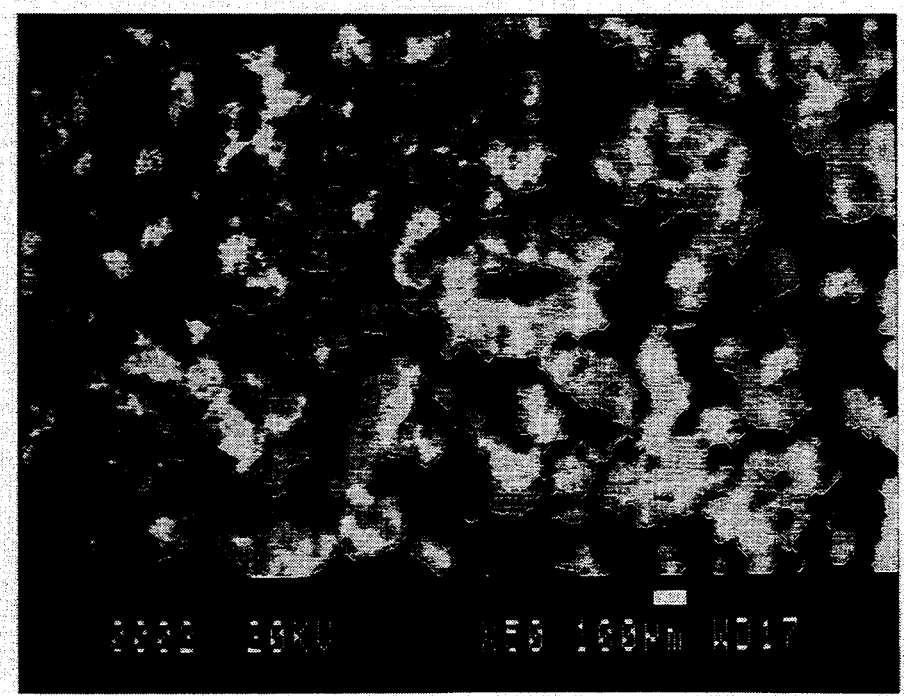
Figure 2B:
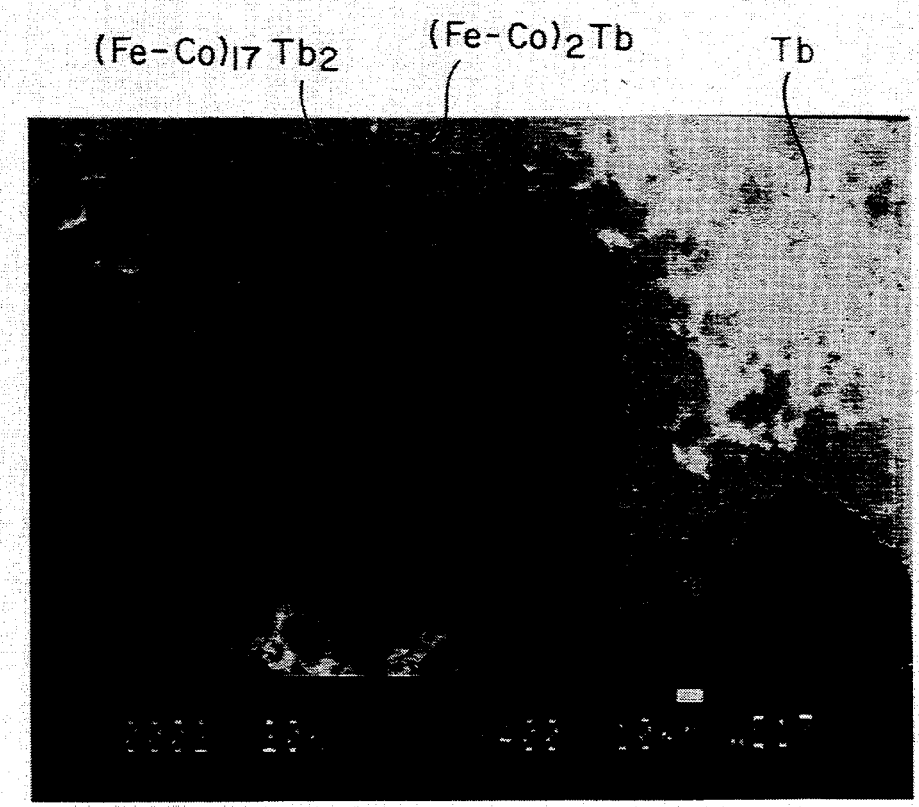

Melts having tile compositions listed in Tables 3 and 4 were prepared in an ordinary vacuum high-frequency melting furnace and cast in copper molds to form rods having the dimensions of 15 mm$^\Phi \times$ 200 mm$^L$ (the cooling rate varying from 10 to 10$^3$° C./sec). These rods were pulverized with a stamp mill in an Ar atmosphere and classified to form complex phase forming powders having particle sizes in the range of −150 to +325 mesh (100 $\mu$m on average) and mixed with the separately provided powders of various rare earth metals having an average particle size of 100 $\mu$m. The mixing proportions of the two powders are also listed in Tables 3 and 4. By subsequent treatments under the same conditions as in Example 1, samples A–L of the high-strength target material of the present invention were prepared. The proportions of the phases that composed the structures of those samples are listed in Tables 3 and 4. FIG. 2 is a pair of photographs showing the microstructure of sample A as taken with a metallurgical microscope (X50 for FIG. 2-a and X400 for FIG. 2-b).

100 μm were used as starting powders and mixed in tile proportions listed in Tables 5 and 6. By subsequent treatments under the same conditions as in Example 1, prior art high-strength target materials 1–12 were prepared. The proportions of the phases that composed the structures of those samples are listed in Tables 5 and 6. FIG. 3 is a photograph showing the microstructure of

TABLE 3

| Sample High-Strength target material of the Invention | Proportions of mixing starting powders (wt %) | | | | Composing structure (area %) | | | | Permeability (μ) | Deflective strength (kg/mm²) | Utilization factor (vol %) |
|---|---|---|---|---|---|---|---|---|---|---|---|
| | Mixing proportions (wt %) | | Complex phase forming powder | Rare earth metal powder | Precipitated iron-group metal | Complex phase | Rare earth metal phase | Intermetallic compound phase | | | |
| | Rare earth metal | Iron-group metal | | | | | | | | | |
| A | Tb:10 | Fe:80, Co:10 | 59 | Tb:41 | 28 | 48 | 31 | bal. | 12 | 9 | 23 |
| B | Gd:3 | Fe:97 | 51 | Gd:49 | 37 | 42 | 37 | bal. | 18 | 13 | 21 |
| C | Dy:3 | Co:97 | 51 | Dy:49 | 20 | 23 | 17 | bal. | 13 | 9 | 23 |
| D | Ho:16 | Fe:84 | 65 | Ho:35 | 21 | 52 | 26 | bal. | 9 | 7 | 25 |
| E | Tm:23 | Ni:77 | 76 | Tm:24 | 6 | 63 | 16 | bal. | 5 | 6 | 27 |
| F | Er:22 | Fe:73, Ni:5 | 77 | Er:23 | 8 | 75 | 23 | bal. | 4 | 5 | 27 |

TABLE 4

| Sample High-Strength target material of the Invention | Proportions of mixing starting powders (wt %) | | | | Composing structure (area %) | | | | Permeability (μ) | Deflective strength (kg/mm²) | Utilization factor (vol %) |
|---|---|---|---|---|---|---|---|---|---|---|---|
| | Mixing proportions (wt %) | | Complex phase forming powder | Rare earth metal powder | Precipitated iron-group metal | Complex phase | Rare earth metal phase | Intermetallic compound phase | | | |
| | Rare earth metal | Iron-group metal | | | | | | | | | |
| G | Tb:10, Tm:10 | Fe:80 | 65 | Tb:35 | 13 | 57 | 29 | bal. | 6 | 7 | 26 |
| H | Gd:5 | Co:95 | 57 | Ho-50% Er alloy 43 | 29 | 37 | 25 | bal. | 11 | 11 | 24 |
| I | Ho:10, Tm:10 | Fe:72, Co:8 | 62 | Tb-20% Gd alloy 38 | 9 | 41 | 23 | bal. | 4 | 10 | 27 |
| J | Ho:4, Tm:4, Er:4 | Co:88 | 59 | Dy:41 | 21 | 37 | 21 | bal. | 9 | 9 | 25 |
| K | Gd:6, Dy:6, Er:8 | Fe:80 | 69 | Gd-50% Dy alloy 31 | 11 | 52 | 20 | bal. | 6 | 7 | 26 |
| L | Tb:2, Tm:4, Dy:2, Er:4 | Co:88 | 59 | Tb-50% Dy alloy 41 | 24 | 42 | 25 | bal. | 9 | 10 | 25 |

COMPARATIVE EXAMPLE

Various iron-group metal powders and rare earth metal powders each having an average particle size of prior art sample 1 as taken with a metallurgical microscope (X100).

TABLE 5

| Sample Prior art high-strength target material | Proportions of mixing starting powders (wt %) | | Composing Structure (area %) | | | Permeability (μ) | Deflective strength (kg/mm²) | Utilization factor (vol %) |
|---|---|---|---|---|---|---|---|---|
| | Rare earth metal | Iron-group metal | Iron-group metal phase | Rare earth metal phase | Intermetallic compound phase | | | |
| 1 | Tb:47 | Fe-11% Co alloy 53 | 37 | 28 | bal. | 76 | 10 | 14 |
| 2 | Gd:40 | Co:60 | 28 | 12 | bal. | 48 | 6 | 16 |
| 3 | Dy:50 | Fe-80% Co alloy 50 | 43 | 41 | bal. | 87 | 14 | 11 |
| 4 | Ho:50 | Ni:50 | 22 | 18 | bal. | 45 | 5 | 17 |
| 5 | Tm:42 | Co-50% Ni alloy 58 | 39 | 22 | bal. | 86 | 9 | 12 |
| 6 | Ho-6% Gd alloy:49 | Fe:51 | 26 | 22 | bal. | 63 | 7 | 15 |

TABLE 6

| Sample Prior art high-strength target material | Proportions of mixing starting powders (wt %) | | Composing Structure (area %) | | | Permeability ($\mu$) | Deflective strength (kg/mm²) | Utilization factor (vol %) |
| --- | --- | --- | --- | --- | --- | --- | --- | --- |
| | Rare earth metal | Iron-group metal | Iron-group metal phase | Rare earth metal phase | Intermetallic compound phase | | | |
| 7 | Ho-6% 47 Gd alloy | Co:53 | 41 | 28 | bal. | 85 | 10 | 11 |
| 8 | Er:25, Tm:24 | Fe:51 | 32 | 27 | bal. | 75 | 10 | 14 |
| 9 | Dy-22% 45 Tb-16% Tm alloy | Fe:55 | 38 | 26 | bal. | 82 | 9 | 12 |
| 10 | Gd-40% 44 Dy-20% Er alloy | Fe:56 | 30 | 18 | bal. | 70 | 8 | 14 |
| 11 | Tb-7% 47 Dy-7% Ho-7% Tm alloy | Co:53 | 36 | 29 | bal. | 79 | 12 | 13 |
| 12 | Tb-38% 47 Gd-12% Ho-12% Er alloy | Fe:53 | 30 | 22 | bal. | 68 | 11 | 13 |

In the next place, all samples of high-strength target materials were measured for their permeability, deflective strength and utilization factor. The results of the measurements are shown in Tables 1-6.

The utilization factor of each target material was determined by forming thin magnetooptical recording films on the surface of a substrate with an ordinary magnetron sputtering apparatus under the following conditions:

| | |
| --- | --- |
| Pressure of Ar atmosphere | $3 \times 10^{-3}$ Torr |
| RF output | 200 W |
| Distance between target and substrate | 70 mm |
| Substrate temperature | ambient |
| Film thickness | 0.5 $\mu$m |

The useful life of tile target material was assumed to have ended at tile point of time when the depth of craters formed in the sputtered surface of tile target material reached its bottom surface, and tile utilization factor was expressed in terms of the percent reduction in the weight of the target material at that point of time.

Referring to FIGS. 1 and 2 which show the microstructures of samples 1 and A, respectively, of the high-strength target material of the present invention, the white areas represent the rare earth metal phase, the black areas the complex phase, and the gray areas between the white and black areas represent the intermetallic compound phase which is composed of the phase of reaction between the complex and rare earth metal phases. The crystallized iron-group metal phase is represented by the very dark areas which are dispersed and distributed either in an acicular or dendritic form (FIG. 1) or In an irregular block form (FIG. 2) in the complex phase represented by the black areas.

Thus, the high-strength target material of the present invention differs microstructurally from the prior art version in that in the former, tile crystallized iron-group metal phase is dispersed and distributed in the matrix composed of an intermetallic compound of a rare earth metal and an iron-group metal whereas in the latter, none of such crystallized iron-group metal phase is present. This difference is reflected in tile fact that with comparable high levels of strength being retained, the target material of the present invention has a lower permeability than the prior art version, thus exhibiting a higher utilization factor in the formation of thin films by magnetron sputtering.

As described above, the target material of the present invention retains high strength and yet shows low permeability; hence, when this material is used to form thin magnetooptical recording films by a magnetron sputtering process, the formation of craters in tile sputtered surface will extend broadly in a two-dimensional direction and in a shallow state, thus leading to a marked improvement in the utilization factor of the target material. Consequently, the present invention will offer industrial benefits as exemplified by the potential contribution to the formation of thin magnetooptical recording films with reduced man-power and by factory automation.

What is claimed is:

1. A high-strength target material of low permeability for forming a thin magnetooptical recording film that has a structure comprising:
    (a) 20-75% of a complex phase in which at least one crystallized iron-group metal is dispersed finely and uniformly in a dendritic, acicular or block form in a proportion of 5-40%, of the total complex phase, in a matrix of an intermetallic compound of at least one first rare earth metal and said at least one iron-group metal;
    (b) 15-40% of a rare earth metal phase of at least one second rare earth metal; and
    (c) the remainder being an intermetallic compound phase which is a reaction phase of said complex phase and said rare earth metal phase,
    all percentages being by area,
    wherein the first and second rare earth metals are the same or different.

2. The high-strength target material according to claim 1, wherein said first at least one rare earth metal is selected from the group consisting of Tb, Gd, Dy, Ho, Tm and Er; and said second at least one rare earth metal is selected from the group consisting of Tb, Gd, Dy, Ho, Tm and Er.

3. The high-strength target material according to claim 1, wherein said at least one iron-group metal is selected from the group consisting of Fe, Ni and Co.

4. The high-strength target material according to claim 2, wherein said at least one iron-group metal is selected from the group consisting of Fe, Ni and Co.

5. A high-strength target material of low permeability for forming a thin magnetooptical recording film that has a structure consisting essentially of:
   (a) 20–75% of a complex phase in which at least one crystallized iron-group metal is dispersed finely and uniformly in a dendritic, acicular or block form in a proportion of 5–40%, of the total complex phase, in a matrix of an intermetallic compound of at least one first rare earth metal and said at least one iron-group metal;
   (b) 15–40% of a rare earth metal phase of at least one second rare earth metal; and
   (c) the remainder being an intermetallic compound phase which is a reaction phase of said complex phase and said rare earth metal phase,
   all percentages being by area,
   wherein the first and second rare earth metals are the same or different.

6. The high-strength target material according to claim 5 consisting essentially of 46% of the complex phase containing 26% of the at least one iron-group metal, wherein the at least one iron-group metal is a mixture of Fe and Co; 28% of the rare earth metal phase; wherein each of the at least one first rare earth metal and the at least one second rare earth metals are Tb; and the remainder being the intermetallic compound phase.

7. The high-strength target material according to claim 5 consisting essentially of 63% of the complex phase containing 6% of the at least one iron-group metal, wherein the at least one iron-group metal is cobalt; 17% of the rare earth metal; wherein each of the at least one first rare earth metal and the at least one second rare earth metal is Gd; and the remainder being the intermetallic compound phase.

8. The high-strength target material according to claim 5 consisting essentially of 43% of the complex phase containing 38% of the at least one iron-group metal, wherein the at least one iron-group metal is a mixture of Fe and Co; 37% of the rare earth metal phase; wherein each of the at least one first rare earth metal and the at least one second rare earth metal is Dy; and the remainder being the intermetallic compound phase.

9. The high-strength target material according to claim 5 consisting essentially of 23% of the complex phase containing 20% of the at least one iron-group metal, wherein the at least one iron-group metal is Ni; 17% of the rare earth metal phase; wherein each of the at least one first rare earth metal and the at least one second rare earth metal is Ho; and the remainder being the intermetallic compound phase.

10. The high-strength target material according to claim 5 consisting essentially of 74% of the complex phase containing 7% of the at least one iron-group metal, wherein the at least one iron-group metal is a mixture of Co and Ni; 22% of the rare earth metal phase; wherein each of the at least one first rare earth metal and the at least one second rare earth metal is Tm; and the remainder being the intermetallic compound phase.

11. The high-strength target material according to claim 5 consisting essentially of 39% of the complex phase containing 8% of the at least one iron-group metal, wherein the at least one iron-group metal is Fe; 21% of the rare earth metal phase; wherein each of the at least one first rare earth metal and the at least one second rare earth metal is Er; and the remainder being the intermetallic compound phase.

12. The high-strength target material according to claim 5 consisting essentially of 38% of the complex phase containing 30% of the at least one iron-group metal, wherein the at least one iron-group metal is Co; 26% of the rare earth metal phase; wherein the at least one first rare earth metal is Gd and the at least one second rare earth metal is Ho; and the remainder being the intermetallic compound phase.

13. The high-strength target material according to claim 5 consisting essentially of 55% of the complex phase containing 12% of the at least one iron-group metal, wherein the at least one iron-group metal is Fe; 28% of the rare earth metal phase; wherein the at least one first rare earth metal is Tm and at least one second rare earth metal is a mixture of Tm and Er; and the remainder being the intermetallic compound phase.

14. The high-strength target material according to claim 5 consisting essentially of 51% of the complex phase containing 20% of the at least one iron-group metal, wherein the at least one iron-group metal is Fe; 25% of the rare earth metal phase; wherein the at least one first rare earth metal is Tb and the at least one second rare earth metal is an alloy of Dy and Tm; and the remainder being the intermetallic compound phase.

15. The high-strength target material according to claim 5 consisting essentially of 47% of the complex phase containing 14% of the at least one iron-group metal, wherein the at least one iron-group metal is Fe; 19% of the rare earth metal phase; wherein the at least one first rare earth metal is a mixture of Gd, Dy and Er and the at least one second rare earth metal is an alloy of Gd and Dy; and the remainder being the intermetallic compound phase.

16. The high-strength target material according to claim 5 consisting essentially of 48% of the complex phase containing 19% of the at least one iron-group metal, wherein the at least one iron-group metal is Co; 27% of the rare earth metal phase; wherein the at least one first rare earth metal is a mixture of Dy, Tm and Ho and the at least one second rare earth metal is Tb; and the remainder being the intermetallic compound phase.

17. The high-strength target material according to claim 5 consisting essentially of 48% of the complex phase containing 6% of the at least one iron-group metal, wherein the at least one iron-group metal is Fe; 21% of the rare earth metal phase; wherein the at least one first rare earth metal is a mixture of Tb, Ho, Gd and Er and the at least one second rare earth metal is an alloy of Tb and Gd; and the remainder being the intermetallic compound phase.

* * * * *